United States Patent [19]

Adcock

[11] 4,421,104

[45] Dec. 20, 1983

[54] CONCENTRATING/TRACKING SOLAR ENERGY COLLECTOR

[76] Inventor: Thomas P. Adcock, 300 Meadowbrook Dr., Huntsville, Ala. 35803

[21] Appl. No.: 338,694

[22] Filed: Jan. 11, 1982

[51] Int. Cl.³ .................................................. F24J 3/02
[52] U.S. Cl. .................................... 126/438; 126/443; 126/446; 126/424
[58] Field of Search ............... 126/438, 439, 440, 445, 126/446, 424, 425, 443

[56] References Cited

U.S. PATENT DOCUMENTS

| 4,027,651 | 6/1977 | Robbins | 126/170 |
| 4,069,811 | 1/1978 | Tabor | 126/443 |
| 4,069,812 | 1/1978 | O'Neill | 126/170 |
| 4,099,516 | 7/1978 | Caulier | 126/438 |
| 4,106,484 | 8/1978 | Dame | 126/438 |
| 4,108,154 | 8/1978 | Nelson | 126/270 |
| 4,127,105 | 11/1978 | Watt | 126/446 |
| 4,184,482 | 1/1980 | Cohen | 126/438 |
| 4,214,573 | 7/1980 | Niedermeyer | 126/438 |
| 4,334,120 | 6/1982 | Yamato et al. | 126/443 |

FOREIGN PATENT DOCUMENTS

| 2458303 | 6/1976 | Fed. Rep. of Germany | 126/438 |
| 3028578 | 2/1982 | Fed. Rep. of Germany | 126/438 |
| 1541034 | 2/1979 | United Kingdom | 126/438 |

Primary Examiner—James C. Yeung
Attorney, Agent, or Firm—John H. Raubitschek; Arthur I. Spechler; Harold W. Hilton

[57] ABSTRACT

A concentrating/tracking solar energy collector comprised of a rotatable reflective trough assembly having a heat absorber assembly integrally therein. A heat exchange tube supports the absorber assembly in the trough and also serves as an axis point about which the collector rotates.

7 Claims, 8 Drawing Figures

CONCENTRATING/TRACKING SOLAR ENERGY COLLECTOR

DEDICATORY CLAUSE

The invention described herein may be manufactured, used, and licensed by or for the Government for governmental purposes without the payment to me of any royalties thereon.

FIELD OF THE INVENTION

The present invention relates generally to solar energy collectors and is suitable for use in any type solar heating system installation. More specifically, the invention relates to the novel design and arrangement of the components to provide two independent, but integrally constructed, assemblies, each of which provides protection from climatic conditions. One assembly being used to provide a highly reflective element for concentrating solar energy (short wave) radiation on the solar energy absorbing element which traps the short wave radiation and can convert this trapped energy to either electrical output for direct use or heat output for transfer to a liquid or gas media storage system (or both actions simultaneously). The energy thus produced can be utilized to provide either heat for water or area heating and/or electrical power for converting to use for lighting, cooling unit motors, power tools, etc.

BACKGROUND OF THE INVENTION

Solar collectors of various types and designs are well known and many are commercially available, however, they have not attracted great interest due to the high cost of installation. Both flat plate and concentrating (tracking) collectors in use today are primarily high cost (due to special design, construction and assembly requirement) and are usually not within a price range of the average home owner.

Flat plate collectors usually weigh 6 to 10 pounds per square foot. Efficiencies of most flat plate collectors also range from 30% to 60%. Installation costs are usually high due to weight (roof loading consideration may require additional bracing/construction) and special handling equipment is required for installation/maintenance.

Concentrating collectors, because of close tolerances and special design criteria of components, usually require special skills/tools for installation. Efficiencies of concentrating collectors are much greater than flat plat collectors which reduces the total number of square feet required, however, this reduction is offset by the higher cost.

Applicant's apparatus is a low cost, lightweight, high efficiency collector which can be manufactured in either kit form or pre-assembled form and does not require special skills or equipment for assembly or installation.

SUMMARY OF THE INVENTION

A concentrating/tracking solar energy collector including a rotatable reflective trough assembly having a heat absorber assembly mounted therein. The reflective trough assembly is comprised of a highly reflective (polished, mirrored finish) trough with end plates, a clear plastic cover lens covers the trough. The solar absorber assembly is comprised of a heat exchange tube (for liquid or gas media flow) extending along the length of the trough and out of the end plates. The heat exchanger tube is supported by engagement of the heat exchange tube with the end plate grommets. The tube also supports an absorber plate in the trough. An absorber lens cover is provided to cover the absorber plate. A heat transfer lubricant is provided between the heat exchange tube (which also acts as the rotating axis) and the absorber plate. Solar cells may also be mounted to the absorber plate, if desired.

DESCRIPTION OF THE PREFERRED EMBODIMENT

Figure 1:
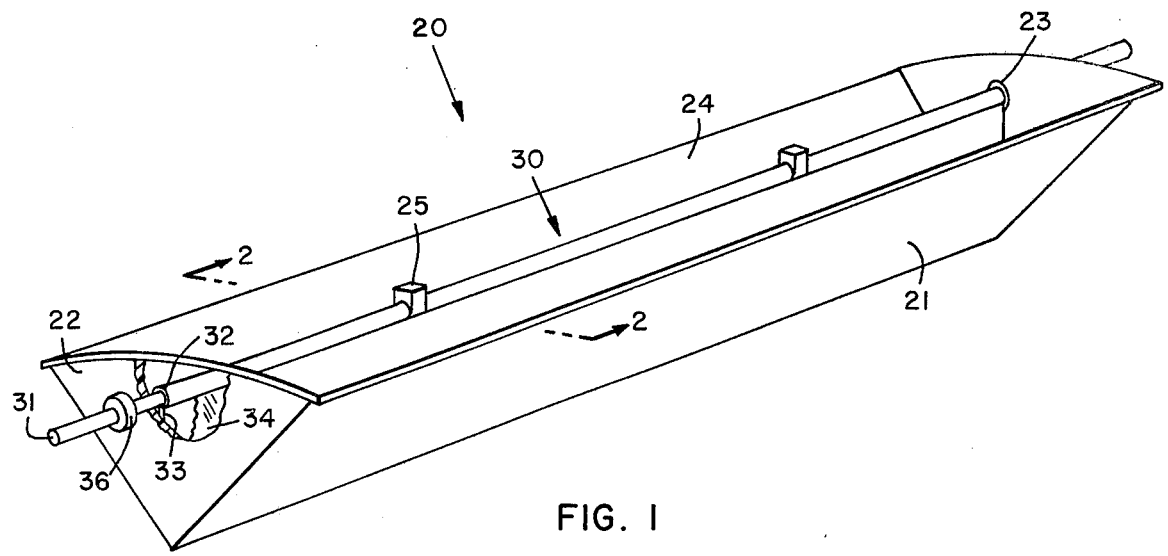
FIG. 1 is a pictorial view, partially sectioned of a collector assembly.
Figure 2:
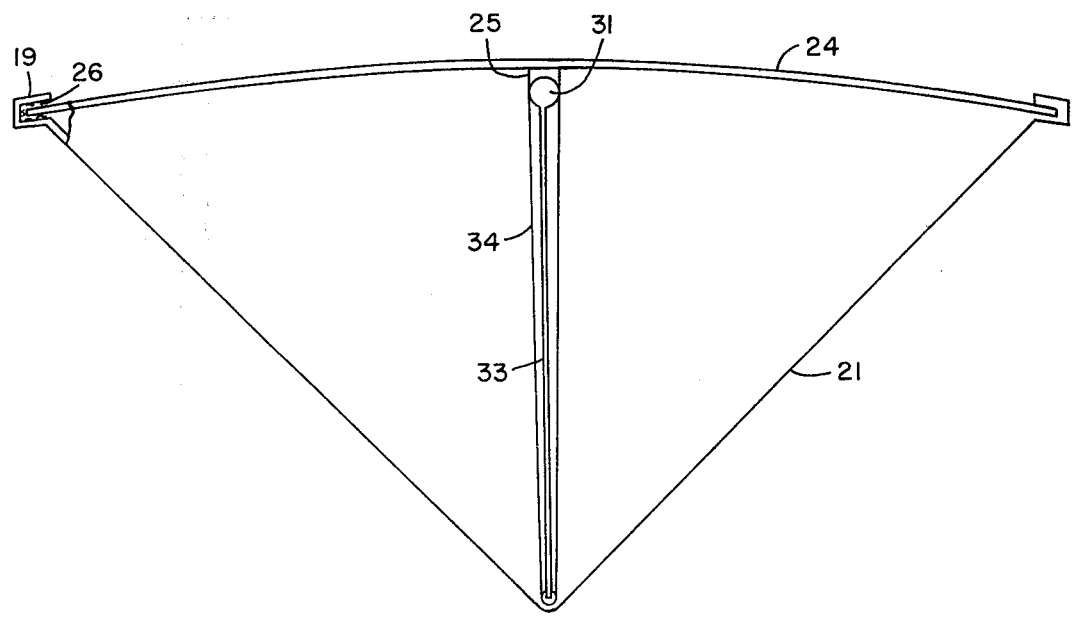
FIG. 2 is an enlarged sectional view taken on the line 2—2 of FIG. 1.
Figure 3:
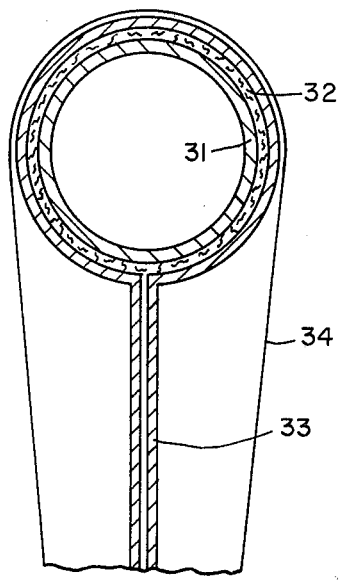
FIG. 3 is an enlarged sectional view of the solar absorber assembly, showning individual component elements.

Referring now to FIGS. 1-3 of the drawings, the solar energy collector includes a solar reflector assembly 20 comprised of a reflector trough 21, reflector trough and plates 22, end plate bearing grommets 23, reflective trough cover lens 24, cover lens spacers 25, waterproof sealant material 26; and a solar aborber assembly 30 comprised of a heat exchanger tube 31, heat conducting lubricant 32, solar energy absorber plate 33, absorber plate cover lens 34, lens spacer strip 35, heat exchanger tube locking collar 36. The reflective trough 21 and end plates 22 are formed of suitable thin gauge metal by conventional roll forming methods (or sheet metal breaking) or can be formed of extrusion molded plastic through a die shaped to the trough configuration and injection molded end plates.

The inner surfaces of the trough 21 and end plates 22 are polished (mirrored) to provide a highly reflective surface.

End plate grommets 23 are of standard rubber or nylon material which are weather sealed in the end plates 22 by using silicone rubber sealer 26 and selected size for close tolerance fit to the heat exchanger tube 31. These grommets 23 provide the weather proof rotating bearing surface between the trough end plates 22 and the heat exchanger tube 31.

The reflective trough cover lens 24 is made of suitable clear plastic or other clear material and is sealed into the preformed channels 19 (FIG. 2) of the trough 21 and end plates 22 by a silicone rubber sealant 26 and provides both rigidity and weatherproofing of the collector assembly. The sealant may be similar to Dow-Corning DC-4 or other suitable high temperature sealant. Cover lens spacers 25 are bonded to cover lens 24 along the center line axis at suitable intervals to provide proper spacing between the cover lens 24 and the absorber assembly 30. Installation of absorber assembly 30 precedes final assembly and sealing of trough cover lens 24 and end plates 22.

The solar absorber assembly 30 is comprised of a metal heat exchange tube 31 (preferably copper or aluminum of suitable size) in thermal contact with the absorber plate 33 by means of a heat conducting silicone lubricant 32. The lubricant 32 provides for both heat transfer and rotational movement between the absorber plate 33 and the heat exchange tube 31. The absorber plate 33 is formed of suitable thin gauge metal by conventional roll forming methods (or sheet metal tooling) or extrusion molded (utilizing high temperature black plastic or other suitable material) through a die shaped to the absorber plate configuration. The absorber plate 33 (if metal) can be stapled, spot welded or solvent bonded on adjoining faces to maintain shape and the exterior surfaces may either be coated with suitable selective solar absorbent coating (such as black nickel) or painted with suitable selective flat black, high temperature paint. Proper clearance is provided between the inside tubular section of the absorber plate 33 and the heat exchange tube 31 to allow a small spacing for silicone lubricant 32 and thermal expansion of components. Absorber cover lens 34 is made from clear, thin walled, high temperature (thermal) plastic tubing or thin film sheet (several types of which are suitable for the purpose). If thin film sheet is used the bottom lap joint and ends can be either heat sealed, solvent bonded or zip-lock channels molded on the edges of the film can be used. The lens cover 34 is isolated from the lower edges of the absorber plate 33 by lens spacer strip 35 attached longitudinally to the absorber plate. The lens spacer strip 35 can be split plastic tubing, extrusion molded strip or other suitable high temperature plastic material. The lens spacer strip 35 and absorber cover lens 34 provide thermal isolation between the absorber plate 33 and the reflective trough 21 and also provides for thermal expansion of the absorber plate 33. Assembly of components of the absorber assembly 30 should be evident from drawings. If desired, valves (not shown) may be installed either on the end plate 22 or reflective trough 21 to allow low pressure dry air or nitrogen to be injected into the collector assembly to further prevent moisture entry. Suitable brackets or adapters (not shown) are mounted to the end plates 22 or reflective trough 21 to provide attachment points for solar tracking drive mechanism rods 45.

Figure 4:
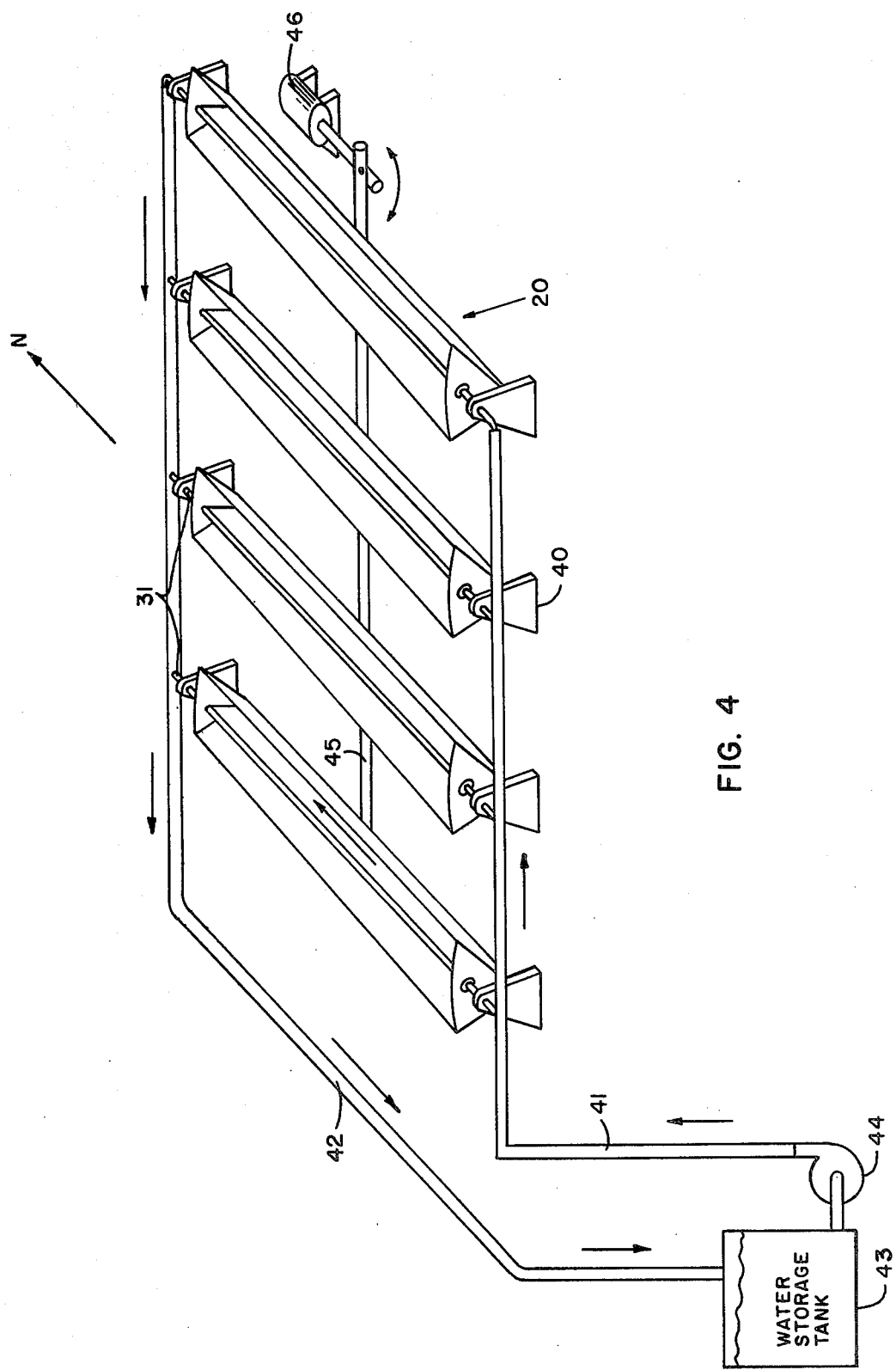
FIG. 4 is a diagrammatic perspective view of several concentrating solar collector units connected in parallel for solar tracking application.

A typical installation of the collector assembly is illustrated in FIG. 4. A number of the collectors are attached to suitable mounting brackets 40 by the heat transfer tubes 31 and connected in fluid relationship to inlet manifold 41 and outlet manifold 42. Collector trough assembly 20 is mechanically connected to solar tracking drive motor 46 through linkages 45. The tracking motors may be any of many available motors which are capable of rotating the trough through approximately 90° to 100° per day. Solar tracking mechanisms including drive linkages for rotating the troughs are well known in the art. In the present invention the heat exchange tubes are mounted so they do not rotate and the troughs rotate about the tubes. Water (as in case shown) is circulated from storage tank 43 by pump 44 through inlet manifold 41, heat exchange pipe 31 and returned to storage tank 43 by way of return manifold piping 42. Solar energy reflected to the heat exchange tube 31 and in turn to the water. All piping systems external to the collectors would be insulated to prevent heat loss.

Figure 6:
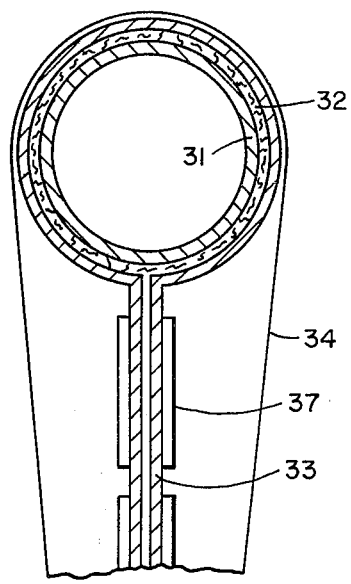
FIG. 6 is an enlarged sectional view similar to FIG. 3 of the solar absorber assembly shown in FIG. 1, showing mounting and relationship of solar electric cells to other components.
Figure 5:
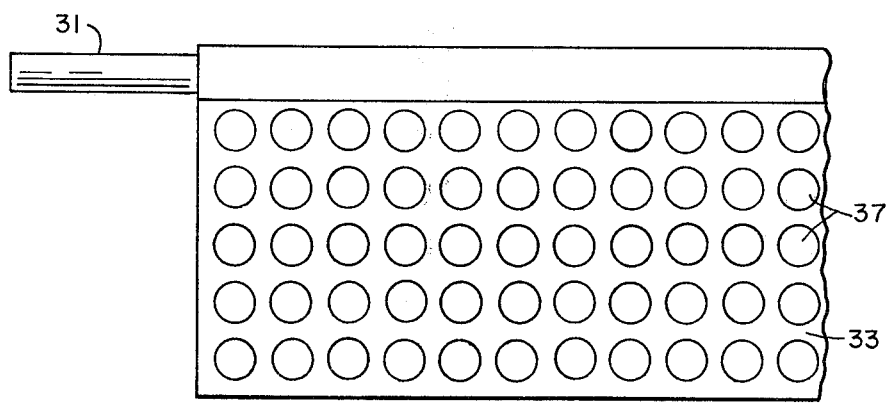
FIG. 5 is an alternate embodiment illustrating a side elevation view of the absorber plate, showing typical placement of solar electric cells.

A modified form of the absorber assembly 30 is shown in FIGS. 5 and 6. The general construction is similar to that described above with the addition of solar electric cells 37 mounted to absorber plate 33. The cells 37 are suitably supported by the absorber plate 33 and are mounted in thermal bond relationship for rapid heat exchange to the absorber plate. Solar electric cells 37 are of the thermo-electric type which generate electricity directly from heat or solar energy radiation, various suitable elements being available. Solar energy reflected to the absorber assembly 30 would thus be converted to both electricity and heat for transfer to the liquid media flowing through heat exchange tube 31. Connecting wiring (not shown) is routed from the solar electric cells 37 through suitable rubber or nylon grommets installed in end plates 22 to the external electrical circuits (storage batteries or converter). Output voltage and current capacity of each collector assembly is predicated on collector sizes and number of cells used. As evident from the preceding description, this configuration collector assembly would allow several operational options, such as: Liquid media heating only; electrical output only, or a combination of electrical and heat energy output.

Figure 7:
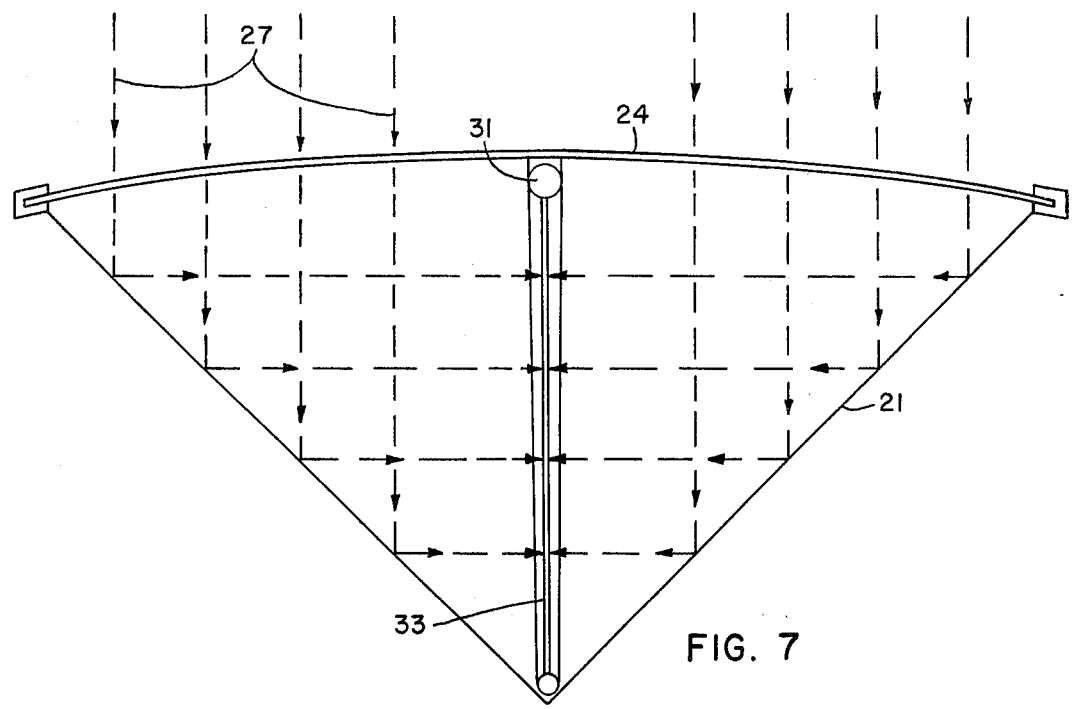
FIG. 7 is an enlarged sectional view similar to FIG. 2 showing reflection of solar energy (short waves) on to the solar absorber assembly.
Figure 8:
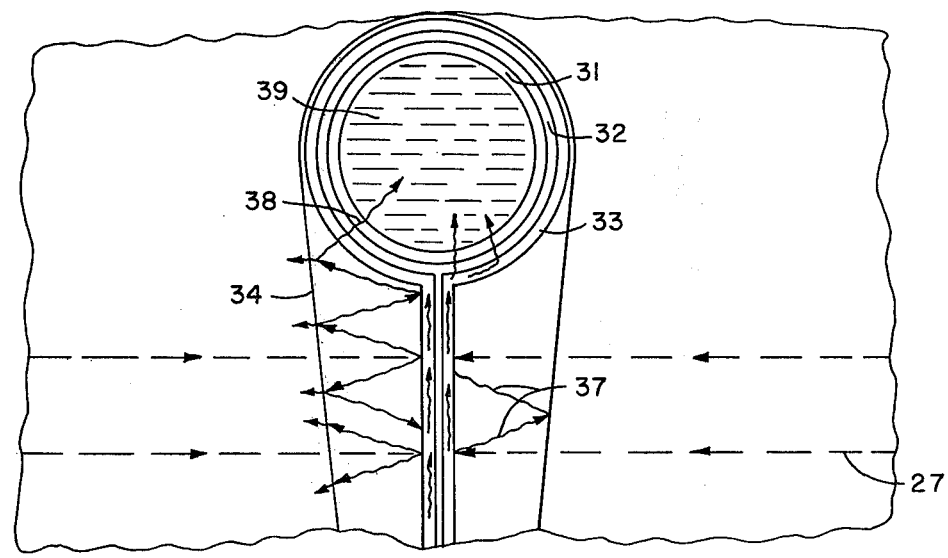
FIG. 8 is an enlarged sectional view of the solar absorber assembly, shown in FIG. 7, showing solar energy (short wave) absorption and heat transfer to the liquid media tube.
Figure 8:
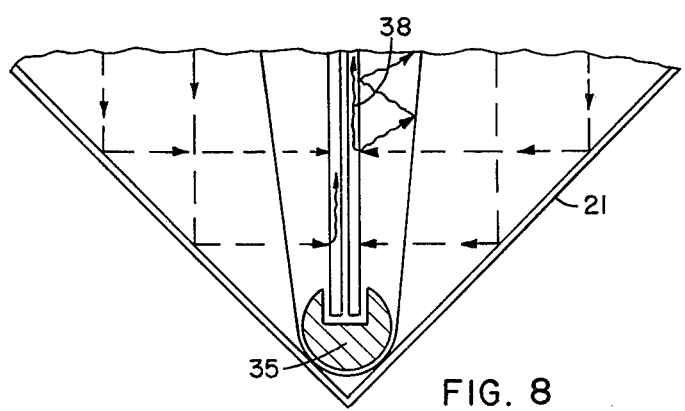

Referring now to FIGS. 7 and 8 for an explanation as to operation of the collector elements as relates to solar energy reflection and absorption characteristics of the collector assembly. Solar energy 27 (short waves) pass through the clear cover lens 24 and strikes the inside polished (mirrored) surface of trough 21 where they are reflected directly toward the absorber assembly 30. Since a polished or mirror surface exhibits a low absorption and a high reflectance to both short and long wave radiation (0.25 to 25 MICRON) most of the solar energy is reflected. The short wave solar energy 27 will pass through the thin, clear absorber lens 34 (as clear plastic exhibits a low absorption and high transmittance characteristic to short wave radiation) and thus strike the blackened absorber plate 33. Since selective black surfaces exhibit a high absorption and low reflectance of short waves the solar radiation is converted to heat energy 38. This heat energy is conducted through the absorber plate 33 to the heat transfer lubricant 32, in turn to the heat transfer tube 31 and finally to the liquid media 39 flowing inside the heat transfer tube 31. Long wave radiation 37 (heat), as illustrated in FIG. 8, emitted from the absorber plate 33 will be dependent on the type selective surface coating applied to the absorber plate 33. In any event, the long wave radiation 37 will be trapped (reflected) by the clear lens 34 of the absorber assembly since the clear plastic material selected exhibits a low transmittance and a high reflectance to long wave energy (5–25 MICRON). The reflected long wave energy 37 is thus directed back to the absorber plate 33 where more heat is collected. This "greenhouse effect" occurs within the confines of the absorber assembly cover lens 34 and traps the greatest amount of usable energy possible. The air space between the outside of the absorber assembly 30 and the inside surface of the reflective trough assembly 20 will therefore remain at a much lower temperature than the absorber.

Since this dead air space provides the effect of insulation between the outside weather conditions and the area inside the absorber lens 34 the need for insulation of the trough 21 is greatly reduced. Increased overall efficiencies of the collector could be increased by the addition of exterior insulation to the trough 21. Although the reflector is shown as having perpendicular sides in relation to each other, for even distribution of solar radiation on the absorber plate, it is apparent that variation in angle relationship or curvature can be used if a smaller area of concentration is desired. It is also apparent that a focusing lens similar to the fresnel configuration could be used in lieu of the clear plastic lens described herein.

I claim:

1. A concentrating, tracking solar energy collector comprising:
   a. A solar reflector assembly including a V-shaped trough having a reflective inner surface and a trough cover lens mounted above said trough; and,
   b. A solar absorber assembly including a heat exchange tube mounted inside said solar reflector assembly and extending along the length thereof, said solar absorber assembly further including an absorber plate rotatably mounted on said heat exchange tube and extending into said trough along the length thereof, said heat exchange tube and said absorber plate having a coating of silicone heat conducting lubricant disposed therebetween to provide for heat conduction from said absorber plate to said heat exchange tube while permitting relative rotation therebetween, and, a heat exchange cover lens mounted in spaced relation over said absorber plate.

2. A concentrating, tracking solar energy collector as in claim 1 wherein said solar reflector assembly further comprises a pair of end plates having grommets therein for support of said heat exchange tube.

3. A concentrating, tracking solar energy collector as in claim 2 wherein said solar reflector assembly includes a waterproof sealant material disposed between said lens cover and said trough.

4. A concentrating, tracking solar collector as in claim 3 wherein said reflector assembly further includes spacer means mounted on said reflector assembly cover lens and in engagement with said solar absorber assembly for clearing said cover lens in spaced relation with said heat exchange tube.

5. A concentrating, tracking solar energy collector as in claim 4 wherein said absorber assembly further includes spacer means mounted between the distal end of said absorber plate and the bottom of said trough.

6. A concentrating, tracking solar energy collector as in claim 5 wherein said absorber plate is adapted to receive a plurality of solar cells thereon, said cells being electrically connected to an electrical storage means.

7. A concentrating tracking solar energy collector as in claim 5 including means for pivotal movement of said collector assembly.

* * * * *